United States Patent [19]

Asakura et al.

[11] Patent Number: 4,913,525

[45] Date of Patent: Apr. 3, 1990

[54] FREQUENCY STABILIZED LIGHT SOURCE

[75] Inventors: Hiroshi Asakura, Osaka; Kiyokazu Hagiwara, Hirakata; Minoru Nishioka, Kobe, all of Japan

[73] Assignee: Matsushita Electric Industrial Co., Ltd., Osaka, Japan

[21] Appl. No.: 334,793

[22] Filed: Apr. 3, 1989

Related U.S. Application Data

[63] Continuation of Ser. No. 30,428, Mar. 26, 1987, abandoned.

[30] Foreign Application Priority Data

Mar. 31, 1986 [JP] Japan .................................. 61-73503
Oct. 29, 1986 [JP] Japan .................................. 61-257233

[51] Int. Cl.$^4$ ........................ G02B 27/42; G02B 5/18; H01S 3/08; H01S 3/10
[52] U.S. Cl. .......................... 350/162.12; 350/162.21; 350/162.23; 372/32; 372/102
[58] Field of Search ...................... 350/162.12, 162.15, 350/162.23, 162.21; 372/29, 32, 92, 102, 106

[56] References Cited

U.S. PATENT DOCUMENTS 4,289,371 9/1981 Kramer ............................ 350/6.2 X

FOREIGN PATENT DOCUMENTS 2129201A 5/1984 United Kingdom .................. 372/20

OTHER PUBLICATIONS

IBM Technical Disclosure Bulletin, vol. 15, no. 2, Jul. 1982, p. 55, New York, U.S.: R. Ludeke: "Multimode Tunable CW GaAs Injection Laser", *Article*.
Patent Abstracts of Japan, vol. 6, No. 170, (E-128) [1049], Sep. 3, 1982 and JP-A-57 85 281 (Takumi Tomijima) 27-05-1982.
Journal of Optics, vol. 13, No. 2, Mar.-Apr. 1982, pp. 71-79, Paris, Fr.: M. Breidne et al.: "A Systematic numerical Study of Fourier Gratings", *Introduction; chapter 2.4; conclusions; FIGS. 1,4*.
Journal of the Optical Society of America A. Optics and Image Science, vol. 2, no. 10. Oct. 1985, p. 1793, Optical Society of America, Woodbury, N.Y., U.S.: A. E. Siegman et al.: "ABCD-Matrix Elements for a Curved Diffraction Grating". *Article*.
Efficient Technique for the Numerical Solution of DIffraction by a Fourier Grating, vol. 4, No. 3, Mar. 1987, pp. 465-472, J. Optical Society of America A.
Microwave Verificatgion of a Numberical Optimization of Fourier Gratings, pp. 147-150, Applied Physics, Springer-Verlag 1981.
J. A. Rossi et al., "High-Power Narrow-Linewidth Operation of GaAs Diode Lasers", Appl. Phys. Lett., vol. 23, No. 1, Jul. 1, 1973.
H. Heckscher et al., "Flashlight-Size External Cavity Semiconductor Laser with Narrow-Linewidth Tunable Output", Appl. Opt., vol. 14, No. 1, 1975.
Ch. Risch et al., "Self-Pulsation in the Output Intensity and Spectrum of GaAs-AlGaAs CW Diode Lasers Coupled to a Frequency Selective External Optical Cavity", J. Appl. Phys., vol. 48, No. 5, 1977.
M. W. Fleming et al., "Spectrum Characteristics of External Cavity Controlled Semiconductor Lasers", IEEE. J. Quant. Elect., vol. QE-17, No. 1, 1981.

(List continued on next page.)

Primary Examiner—Bruce Y. Arnold
Assistant Examiner—Martin Lerner
Attorney, Agent, or Firm—Wenderoth, Lind & Ponack

[57] ABSTRACT

Disclosed is a frequency stabilized light source including a semiconductor laser chip and a finite Fourier diffraction grating with a corrugated profile with a continuous first order differential coefficient. The laser chip emits the output light from its one facet into the diffraction grating with the diffracted light from the grating being fed back to the laser chip, so that the laser chip emits the output light with a stable wavelength from its another facet. The arrangement produces the output light with high frequency purity and high adjustment accuracy and yet wide frequency tunable range.

6 Claims, 8 Drawing Sheets

OTHER PUBLICATIONS

M. R. Matthews et al., "Packaged Frequency-Stable Tunable 20 kHz Linewidth 1.5 m External Cavity Laser", Elec. Lett., vol. 21, No. 3, 1985.

M. Delabachelerie et al., "An 850 nm Semiconductor Laser Tunable Over a 300 Range", Opt. Comm., vol. 55, No. 3, 1985.

Spectral Linewidth of External Cavity Semiconductor Lasers With Strong, Frequency-Selective Feedback, R. Wyatt, Electronics Letters, Jul. 18, 1985, vol. 21, No. 15.

Single Longitudinal Mode Operation of CW Junction Lasers by Frequency-Selective Optical Feedback, Thomas L. Paoli, Applied Physics Letters, vol. 25, no. 12, Dec. 15, 1974.

Sincerbox, G. T., "Formation of Optical Elements by Holography", *IBM Tech. Discl. Bull.*, vol. 10, No. 3, Aug. 1967, pp. 267–268.

FREQUENCY STABILIZED LIGHT SOURCE

This is a continuation of now abandoned application Ser. No. 07/030,428 filed Mar. 26, 1987.

BACKGROUND OF THE INVENTION

1. Field of the Invention

The present invention relates to a light source for use in optical communication, optical recording and optical measurement.

2. Description of the Prior Art

Figure 1A:
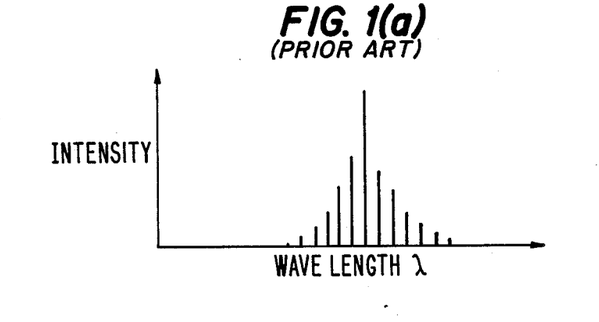
FIGS. 1(a) and 1(b) are spectral graphs showing the oscillating spectrums of the semiconductor laser chip and those of the conventional frequency stabilized light source, respectively.
Figure 1B:
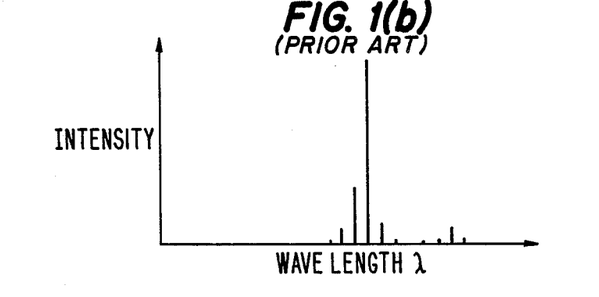

Conventionally, semiconductor laser has been used as a light source for optical communications and optical recording systems. However, since semiconductor laser has its oscillation wavelength varied depending on the temperature and the amount of injection current, it oscillates in multiple modes as shown in FIG. 1(a). To cope with this matter in making a light source, the laser chip is combined with a frequency selective external cavity so as to construct a light source which is controlled to oscillate at a specific wavelength as shown in FIG. 1(b). For the external cavity, an echellette grating, having a saw tooth cross-section, has been used.

Figure 2:
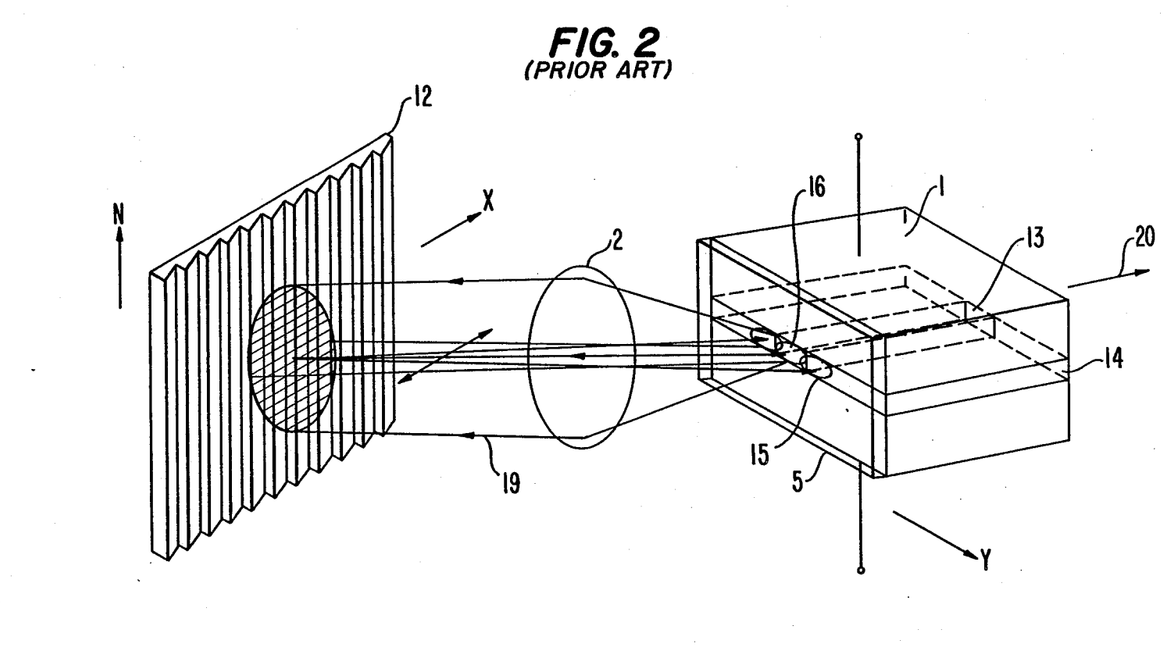
FIG. 2 is a perspective view showing the structure of the conventional frequency stabilized light source.

FIG. 2 shows the structure of the conventional light source. A light beam 19 coming out of one facet of a semiconductor laser chip 1 is collimated by a lens 2, and it is incident on an echellette grating 12. The incident light 19 is dispersed depending on its wavelengths, and a light beam 16 with a specific wavelength determined from the angle of the grating 12 is fed back to the active layer 13 of the semiconductor laser chip 1. The semiconductor laser chip 1 oscillates at the wavelength of the feedback light 16 and emits an output light beam 20 with a stabilized frequency from the other facet. The oscillation frequency of the semiconductor laser chip 1 can be changed by rotating the echellette grating 12. The above-mentioned stabilized light source is described in detail in a publication by R. WYATT, entitled "SPECTRAL LINEWIDTH OF SEMICONDUCTOR LASERS WITH STRONG, FREQUENCY-SELECTIVE FEEDBACK", ELECTRONICS LETTERS, 18th July 1985, Vol. 21, No. 15, pp. 658–659; a publication by Thomas L. Paoli et al., entitled "Single longitudinal mode operation of cw injection lasers by frequency-selective optical feedback", Applied Physics Letters, Vol. 25, No. 12, 15th Dec. 1974, pp. 744–746; and Japanese Patent Application of Laid-open No. 57-85281.

Figure 3:
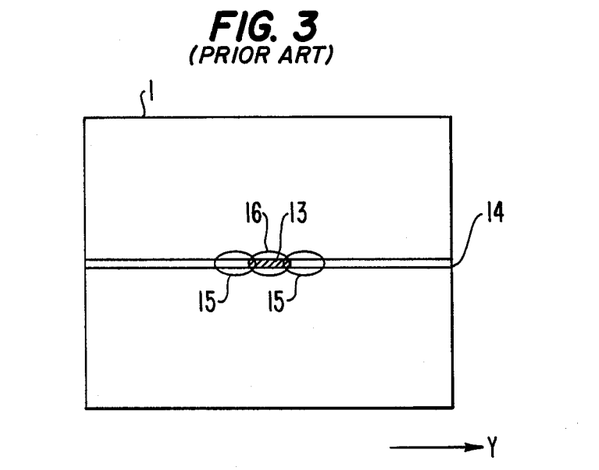
FIG. 3 is a diagram showing the feedback beam spot on the active layer on the semiconductor laser chip in the conventional light source shown in FIG. 2.

However, due to the polarization dependency of the echellette grating 12, the conventional frequency stabilized light source has been restricted in the disposition of the semiconductor laser chip 1 and grating 12. The echellette grating 12 has a higher diffraction efficiency for the polarized light which electric field is perpendicular to the groove direction N, i.e., S-polarization, while it has a lower diffraction efficiency for the polarized light which electric field is parallel to the groove direction N, i.e., P-polarization. The semiconductor laser chip 1 has the output light 19 polarized in the Y direction parallel to its pn junction plane, and therefore the components must have been disposed such that the pn junction plane 14 of the semiconductor laser chip 1 is at right angles with the groove direction N of the echellette grating 12. In this arrangement, feedback light beams 15 and 16 from the grating 12 align along the pn junction plane 14, causing the light beams 15 of unnecessary adjacent mode to be incident on the active layer 13 as shown in FIG. 3. This results in the generation of spurious modes as shown in FIG. 1(b) and thus in a degraded wavelength selectivity, adjustment accuracy and wavelength purity.

In another case where the pn junction plane 14 of the semiconductor laser chip 1 is parallel to the groove direction N of the echellette grating 12, a very weak feedback light 16 is incident on the semiconductor laser chip 1 due to P-polarization incidence, resulting in a degraded frequency stability and tunable range. Particularly, when a light beam with a wavelength distant from the gain center of the semiconductor laser chip 1 is fed back, suppression of spurious modes falls significantly and oscillation becomes unstable. Accordingly, a practical light source cannot be realized in this dispositional scheme.

SUMMARY OF THE INVENTION

It is an object of the present invention to provide a sophisticated frequency stabilized light source which has a high frequency purity and adjustment accuracy and yet a wide frequency tunable range.

In order to achieve the above objective, the frequency stabilized light source of the invention comprises a semiconductor laser chip and a Fourier diffraction grating with a corrugation having continuous first-order differential coefficients. In operation, the semiconductor laser chip emits a light beam from its one facet to the Fourier diffraction grating, and a diffracted light beam from the grating is fed back to the semiconductor laser chip, so that an output light beam having a stable wavelength is obtained at the other facet of the laser chip. Preferably, the components are disposed so that the pn junction plane of the semiconductor laser chip is substantially parallel to the groove direction of the Fourier grating.

DESCRIPTION OF THE PREFERRED EMBODIMENTS

Figure 4:
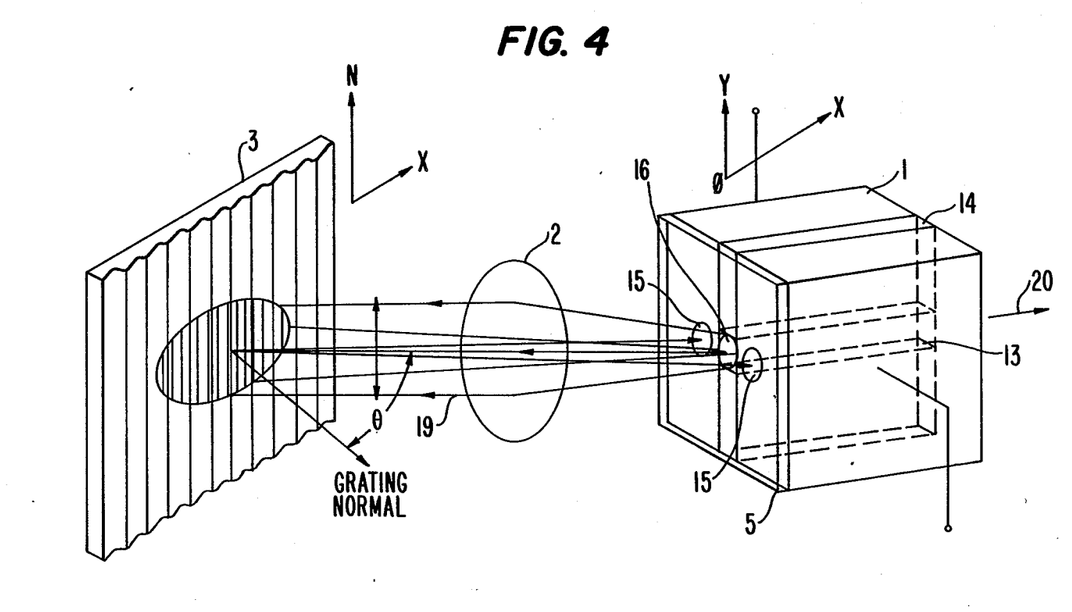
FIG. 4 is a perspective view of the first embodiment of this invention.

The first embodiment shown in FIG. 4 includes a semiconductor laser chip 1, a lens 2, a finite Fourier diffraction grating 3 and an anti-reflection coating 5. A light beam 19 coming out of one facet of the semiconductor laser chip 1 is collimated by the lens 2, and it is incident on the Fourier grating 3. The incident light is dispersed depending on its wavelengths, and the light with a specific wavelength determined from the angle of the grating 3 is fed back to the active layer 13 of the semiconductor laser chip 1. The semiconductor laser chip 1 oscillates stably at the wavelength of the feedback light 16, and emits a frequency stabilized output light 20 from the other facet thereof. The output light 20 from the semiconductor laser chip 1 has its wavelength varied by the rotation of the grating 3.

The anti-reflection coating 5 is to enhance the coupling efficiency of the semiconductor laser chip 1 with the feedback light 16 from the grating 3.

The embodiment of FIG. 4 has the orthogonal relationship between the dispersing direction X of the grating 3 and the direction Y of the pn junction plane of the laser chip 1.

Figure 5A:
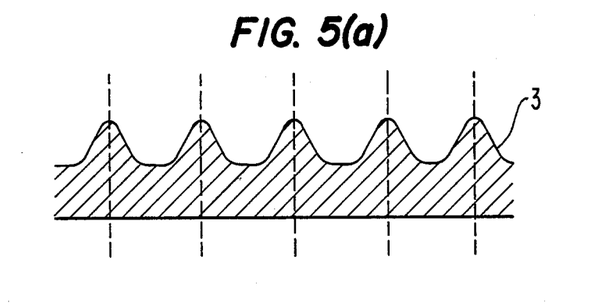
FIGS. 5(a), 5(b) and 5(c) are cross-sectional views of Fourier grating.
Figure 5B:
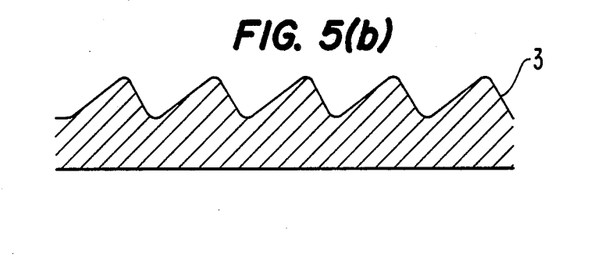
Figure 5C:
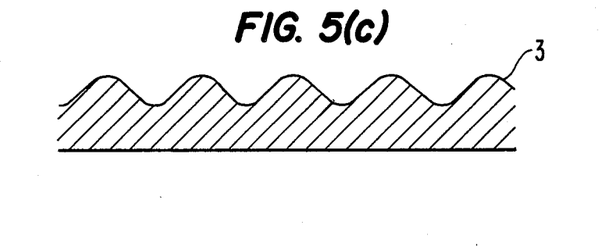

The Fourier grating 3 has its cross-section shaped smoothly due to the absence of discontinuous points in the first order differential coefficients, as shown in FIGS. 5(a), 5(b) and 5(c), and it can be expressed by the fundamental sinusoidal wave superimposed by its finite harmonics. The profile of FIG. 5(a) is symmetric with respect to the ridge center, while the profile shown in FIG. 5(b) is asymmetric, and their difference is derived from the phase difference of the harmonic components. The profile of FIG. 5(c) is of the case of a sole fundamental sinusoidal wave.

Figure 6:
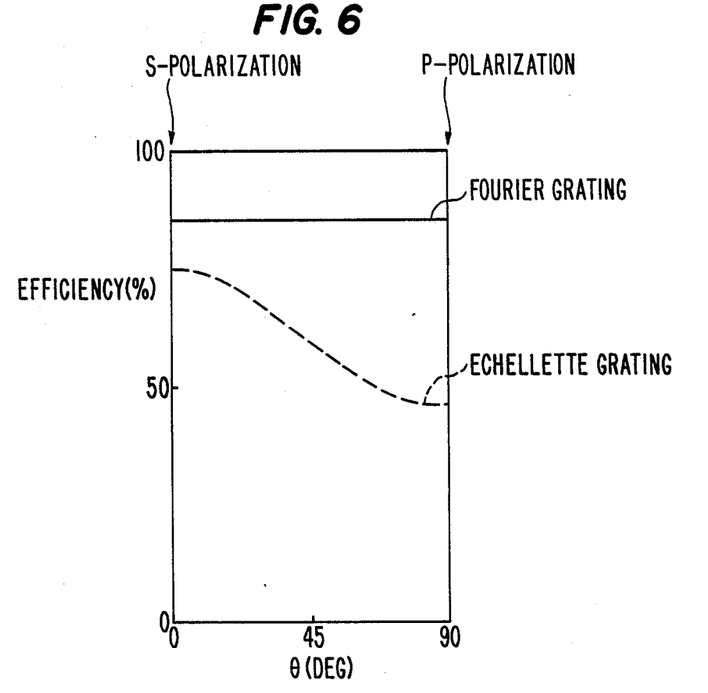
FIG. 6 is a graph showing the polarization dependencies of the efficiency of the echellette grating and finite Fourier grating.

The Fourier grating features the high efficiency of polarization characteristic which cannot be achieved by the echellette grating. FIG. 6 shows the measurement result of diffraction efficiency for the polarized light by the conventional echellette grating and the Fourier grating. The diffraction efficiencies of the both cases are plotted on the vertical axis against the angle $\Theta$ between the dispersing direction X of the grating and the direction Y of the pn junction plane on the horizontal axis, using a measurement wavelength $\lambda$ of 0.83 $\mu$m and a grating groove pitch of 0.83 $\mu$m. The Fourier grating has less polarization dependency and higher efficiency. Its efficiency is higher by 40% than that of the echellette grating in P-polarization.

In case a P-polarized light is incident on the echellette grating, currents in the groove direction are induced at the top of each of the ridges, resulting in an increased loss and degraded efficiency. On the other hand, conceivably owing to the smooth profile, the Fourier grating is free from such induction of concentrated currents and its efficiency is not deteriorated. The Fourier grating has especially high efficiency when the light wavelength $\lambda$ and the grating groove pitch d are related as:

$$0.2 < \lambda/d < 1.7.$$

Figure 7:
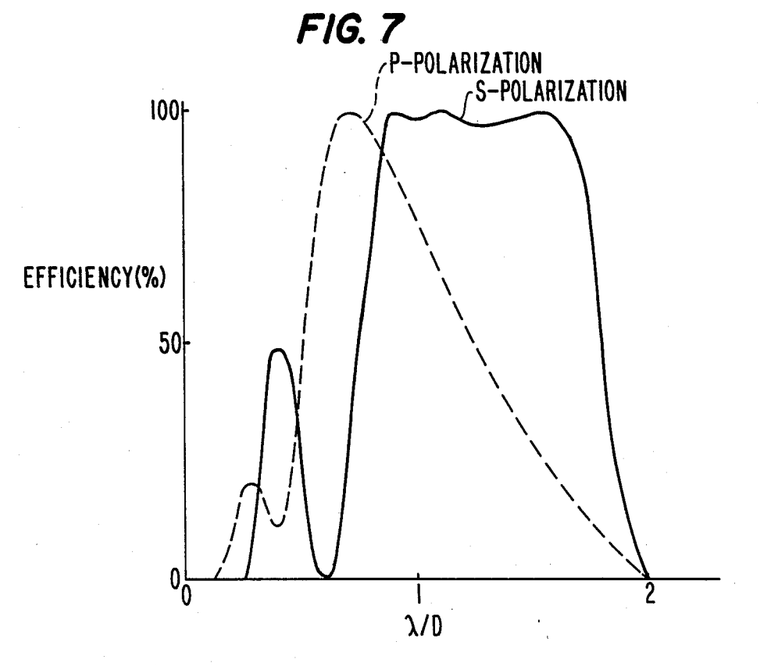
FIG. 7 is a graph showing the polarization characteristics of the Fourier grating.

The efficiency characteristic can be changed by choosing the value of the parameter $\lambda/d$ as shown in FIG. 7. Accordingly, it is not necessary to confine the light incident system to the S-polarized light.

Figure 8A:
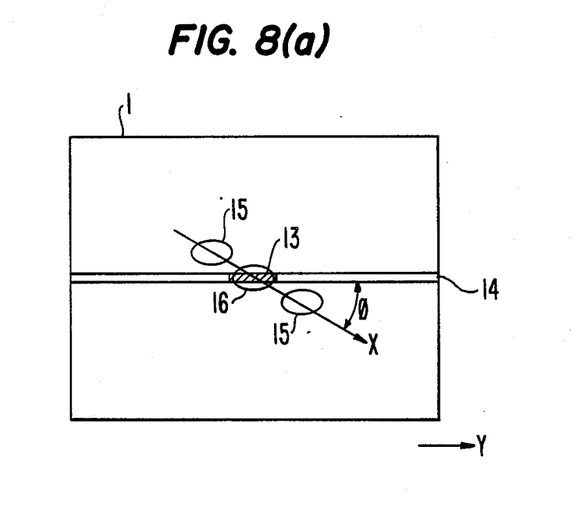
FIGS. 8(a) and 8(b) are diagrams showing the positional relationship between the feedback beam spot and the active layer on the semiconductor laser chip according to this invention.

In consequence, by tilting the dispersing direction X of the grating 3 relative to the direction Y of the pn junction plane 14 or the active layer 13 as shown in FIG. 8(a), spurious feedback light spots 15 can be kept away from the active layer 13, and yet an intense light feedback can be accomplished. Namely, for the angle $\Theta$ between the normal of the grating 3 and the optical axis of the lens 2, the focal length f of the lens 2, the numerical aperture NAmax of the lens 2, and the longitudinal mode interval $\delta\lambda$, the required condition for the angle $\phi$ between X and Y for an oscillation wavelength of $\lambda$ is:

$$\cos\phi \geq d \cdot \cos\Theta \cdot \lambda / (f \cdot \delta\lambda \cdot NAmax) \quad (1)$$

Figure 8B:
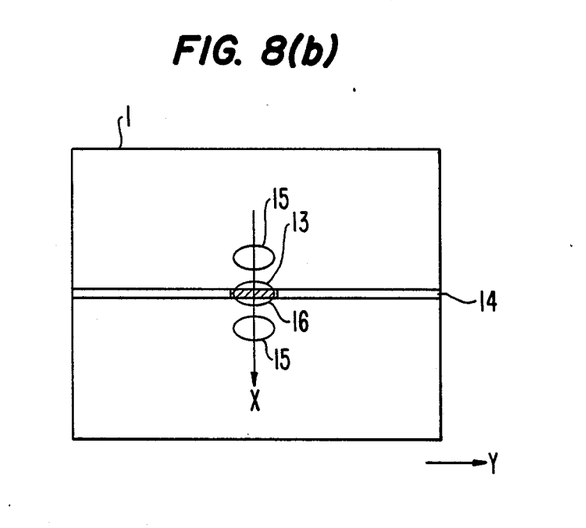

The spurious lights 15 do not contribute to the oscillation of the semiconductor laser chip 1 so far as the equation (1) is met. Particularly, the orthogonal arrangement of the grating dispersing direction X and the pn junction plane Y provides the best isolation of the spurious light spots 15 as shown in FIG. 8(b), and this is the case of the highest wavelength adjustment accuracy.

Figure 9:
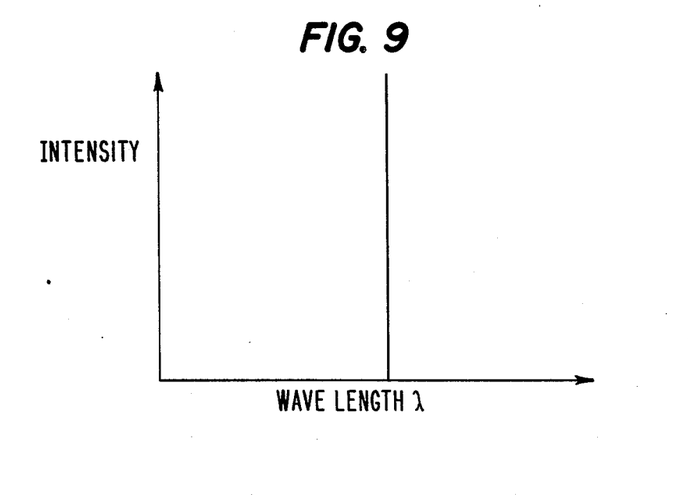
FIG. 9 is a spectral graph showing the oscillating spectrum of the frequency stabilized light source according to this invention.

FIG. 9 shows the oscillating spectrum of the frequency stabilized light source of the invention. Adjoining spurious modes are completely suppressed, and the laser oscillates at a sole wavelength. Due to P-polarization, the Fourier grating 3 provides a high diffraction light intensity, and therefore the effect of optical feedback is high, the wavelength tunable range is wide, and the output light 20 is strong. In case the oscillation is exerted in the vicinity of the gain center of the semiconductor laser chip 1, the anti-reflection coating 5 is not always necessary.

When a sinusoidal-corrugated diffraction grating shown in FIG. 5(c) is used as the finite Fourier grating 3, it can be manufactured easily and accurately by the holographical exposure method, and its smooth and symmetric profile makes replication easy for mass production. Therefore, this grating is advantageous in the cost reduction of the frequency stabilized light source.

Figure 10:
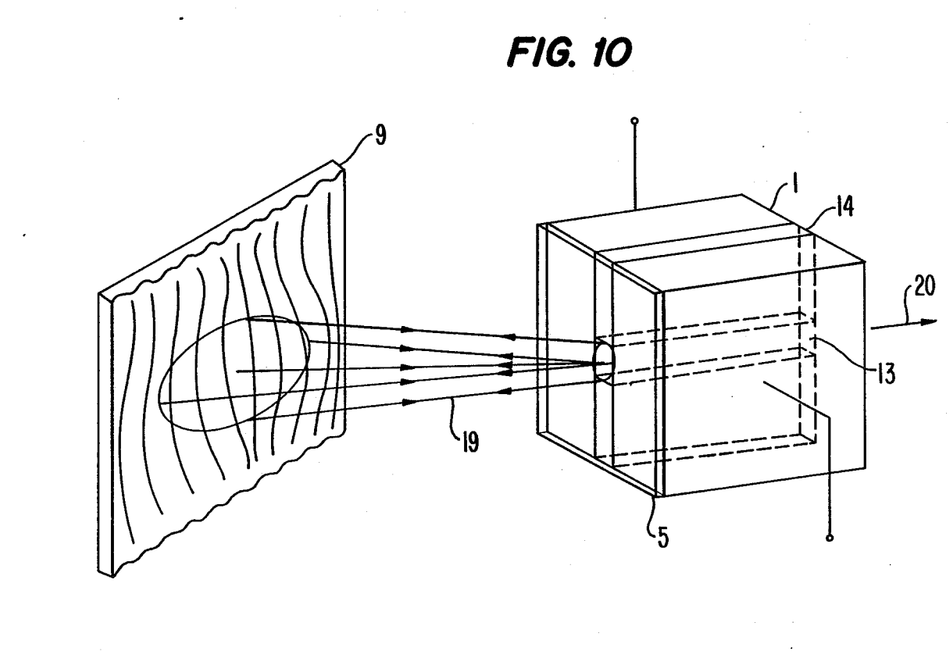
FIG. 10 is a perspective view of the second embodiment of this invention.

FIG. 10 shows the second embodiment of the present invention. The arrangement differs from the first embodiment in that a Fourier curvilinear-corrugated diffraction grating 9 is used as the Fourier grating 3. The Fourier curvilinear-corrugated grating 9 has its grooves curved in a zoneplate fashion, and it has a focusing function along with the dispersive function. The grating 9 by itself serves as a lens, eliminating the need of a collimating lens, and the simplified structure is suited to make the light source compact. Other features and effects are identical to the case of the first embodiment.

Figure 11:
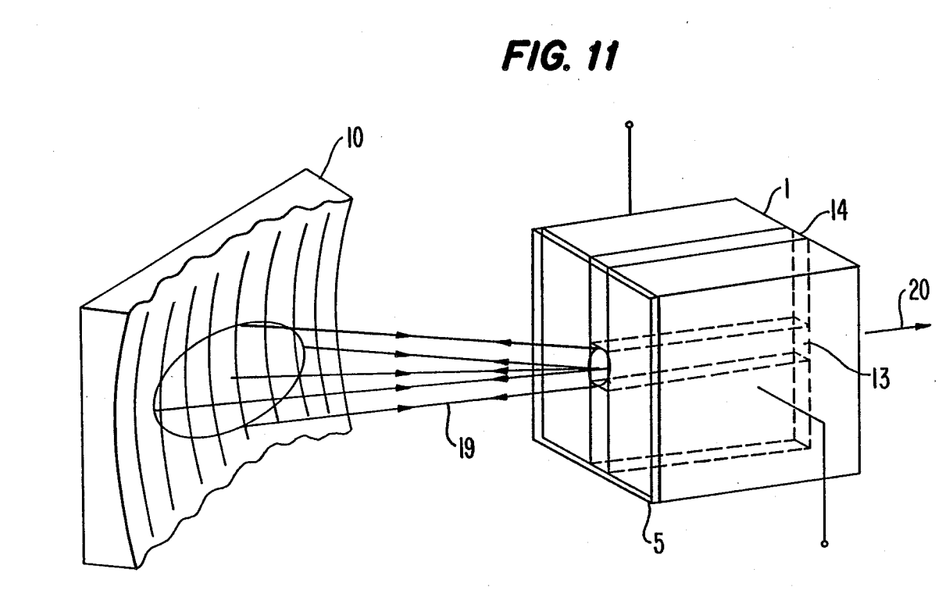
FIG. 11 is a perspective view of the third embodiment of this invention.

FIG. 11 shows the third embodiment of the present invention. The arrangement differs from the first embodiment in that a Fourier concave diffraction grating 10 is used as the Fourier grating 3. The Fourier concave grating 10 not only serves for dispersion, but being a concave mirror by itself it also works for focusing. Through the optimal selection for the curvature and grating parameters of the Fourier concave grating 10, outstanding focusing performance is exerted, and the elimination of lens is suited to make the light source compact. Other features and effects are identical to the case of the first embodiment.

What is claimed is:

1. A frequency stabilized light source comprising:
    a semiconductor laser element having an active layer for emitting a light from one facet of said active layer;

a lens for collimating said light emitted from said one facet of said active layer of said semiconductor layer element;

a Fourier diffraction grating having a corrugated profile and continuous first order differential coefficients for diffracting the light collimated from said lens so that a desired diffracted light from said grating is fed back through said lens to said active layer of said semiconductor laser element so as to cause said semiconductor laser element to emit an output light from another facet of said active layer, wherein said grating is disposed such that its dispersing direction is tilted relative to said active layer of said semiconductor laser element by an angle $\phi$ to thereby prevent a spurious diffracted light from said grating adjacent to said desired diffracted light from being fed back to said active layer of said semiconductor laser element, said angle $\phi$ satisfying substantially the following condition:

$$\cos \phi \geq d \cdot \cos \Theta \cdot \lambda / (f \cdot \delta\lambda \cdot NAmax)$$

where d is a pitch of said corrugated profile of said grating, $\Theta$ is an angle between a normal of said grating and an optical axis of said lens, $\lambda$ is a wavelength of said desired diffracted light, f is a focal length of said lens, $\delta\lambda$ is a difference between said wavelength of said desired diffracted light and a wavelength of said spurious diffracted light, and NAmax is a numerical aperture of said lens.

2. A frequency stabilized light source according to claim 1, wherein said angle $\phi$ is substantially equal to 90 degrees.

3. A frequency stabilized light source comprising:

a semiconductor laser element with an active layer for emitting a light from one facet of said active layer; and a planar Fourier diffraction grating having a corrugated profile and continuous first order differential coefficients for diffracting said light emitted from said one facet of said active layer of said semiconductor laser element so that a desired diffracted light from said grating is fed back to said active layer of said semiconductor laser element so as to cause said semiconductor laser element to emit an output light from another facet of said active layer, said corrugated profile being a curvilinear-corrugated profile so that said grating serves also as a lens for collimating said light emitted from said one facet of said active layer of said semiconductor laser element, wherein said grating is disposed such that its dispersing direction is tilted relative to said active layer of said semiconductor laser element by an angle $\phi$ to thereby prevent a spurious diffracted light from said grating adjacent to said desired diffracted light from being fed back to said active layer of said semiconductor layer element, said angle $\phi$ satisfying substantially the following condition:

$$\cos \phi \geq d \cdot \cos \Theta \cdot \lambda / (f \cdot \delta\lambda \cdot NAmax)$$

where d is a pitch of said corrugated profile of said grating, $\Theta$ is an angle between a normal of said grating and an optical axis of said lens, $\lambda$ is a wavelength of said desired diffracted light, f is a focal length of said lens, $\delta\lambda$ is a difference between said wavelength of said desired diffracted light and wavelength of said spurious diffracted light, and NAmax is a numerical aperture of said lens.

4. A frequency stabilized light source according to claim 3, wherein said angle $\phi$ is substantially equal to 90 degrees.

5. A frequency stabilized light source comprising:

a semiconductor laser element having an active layer for emitting a light from one facet of said active layer; and a Fourier diffraction grating having a corrugated profile and continuous first order differential coefficients for diffracting said light emitted from said one facet of said active layer of said semiconductor laser element so that a desired diffracted light from said grating is fed back to said active layer of said semiconductor laser element so as to cause said semiconductor laser element to emit an output light from another facet of said active layer, said grating being a concave grating so as to also serve as a lens for collimating said light emitted from said one facet of said active layer of said semiconductor laser element, wherein said grating is disposed such that its dispersing direction is tilted relative to said active layer of said semiconductor laser element by an angle $\phi$ to thereby prevent a spurious diffracted light from said grating adjacent to said desired diffracted light from being fed back to said active layer of said semiconductor laser element, said angle $\phi$ satisfying substantially the following condition:

$$\cos \phi \geq d \cdot \cos \Theta \cdot \lambda / (F \cdot \delta\lambda \cdot NAmax)$$

where d is a pitch of said corrugated profile of said grating, $\Theta$ is an angle between a normal of said grating and an optical axis of said lens, $\lambda$ is a wavelength of said desired diffracted light, f is a focal length of said lens, $\delta\lambda$ is a difference between said wavelength of said desired diffracted light and a wavelength of said spurious diffracted light, and NAmax is a numerical aperture of said lens.

6. A frequency stabilized light source according to claim 5, wherein the angle $\phi$ is substantially equal to 90 degrees.

* * * * *